US007879681B2

United States Patent
Kim et al.

(10) Patent No.: US 7,879,681 B2
(45) Date of Patent: Feb. 1, 2011

(54) METHODS OF FABRICATING THREE-DIMENSIONAL CAPACITOR STRUCTURES HAVING PLANAR METAL-INSULATOR-METAL AND VERTICAL CAPACITORS THEREIN

(75) Inventors: Yoon-Hae Kim, Gyeonggi-do (KR); Sun-Oo Kim, Hopewell Junction, NY (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/246,093

(22) Filed: Oct. 6, 2008

(65) Prior Publication Data

US 2010/0087042 A1    Apr. 8, 2010

(51) Int. Cl.
*H01L 21/20* (2006.01)
(52) U.S. Cl. ............ 438/396; 438/393; 257/E21.008
(58) Field of Classification Search .......... 257/E21.015, 257/E21.016; 216/6; 361/271, 301.1, 301.4, 361/303, 304, 328, 330; 438/393, 396, 210, 438/329
See application file for complete search history.

(56) References Cited

U.S. PATENT DOCUMENTS

| | | | | |
|---|---|---|---|---|
| 6,803,306 B2 * | 10/2004 | Tsau | ............ | 438/622 |
| 6,812,126 B1 * | 11/2004 | Paranjpe et al. | ............ | 438/622 |
| 6,819,542 B2 * | 11/2004 | Tsai et al. | ............ | 361/304 |
| 6,881,996 B2 * | 4/2005 | Chen et al. | ............ | 257/296 |
| 7,151,660 B2 * | 12/2006 | Chen et al. | ............ | 361/306.1 |
| 7,259,956 B2 * | 8/2007 | Fong et al. | ............ | 361/306.2 |
| 2002/0022331 A1 * | 2/2002 | Saran | ............ | 438/381 |
| 2003/0040161 A1 * | 2/2003 | Schrenk et al. | ............ | 438/393 |
| 2007/0228506 A1 | 10/2007 | Min et al. | | |
| 2008/0054329 A1 * | 3/2008 | Kim et al. | ............ | 257/306 |
| 2008/0137262 A1 * | 6/2008 | Mahalingam et al. | ............ | 361/301.4 |

FOREIGN PATENT DOCUMENTS

| | | |
|---|---|---|
| JP | 1992-056264 | 2/1992 |
| JP | 1998-326863 | 12/1998 |
| JP | 2001-177056 | 6/2001 |

* cited by examiner

*Primary Examiner*—Phat X Cao
*Assistant Examiner*—Nga Doan
(74) *Attorney, Agent, or Firm*—Myers Bigel Sibley & Sajovec

(57) ABSTRACT

Methods of forming a three-dimensional capacitor network may include forming a first horizontal MIM capacitor on a semiconductor substrate and forming a first interlayer insulating layer on the first horizontal MIM capacitor. A first vertical capacitor electrode is then formed in the first interlayer insulating layer and a second horizontal MIM capacitor is formed on the first interlayer insulating layer. This second horizontal MIM capacitor may be formed by forming an upper capacitor electrode and a lower capacitor electrode. The upper capacitor electrode may be electrically connected by the first vertical capacitor electrode to an upper capacitor electrode of the underlying first MIM capacitor. The lower capacitor electrode, which may be formed in the first interlayer insulating layer, may extend opposite the upper electrodes of the first and second MIM capacitors.

1 Claim, 2 Drawing Sheets

METHODS OF FABRICATING THREE-DIMENSIONAL CAPACITOR STRUCTURES HAVING PLANAR METAL-INSULATOR-METAL AND VERTICAL CAPACITORS THEREIN

FIELD OF THE INVENTION

The present invention relates to methods of fabricating integrated circuit devices and, more particularly, to methods of fabricating integrated circuit devices having passive energy storage structures therein.

BACKGROUND OF THE INVENTION

Many integrated circuits utilize passive structures to store energy therein. These passive structures may be used within special-function circuits that provide backup power, boosted on-chip voltages and charge storage, for example. Conventional passive structures include metal-insulator-metal (MIM) capacitors having planar and U-shaped electrodes as well as vertical capacitors that utilize interconnect and trench-based electrodes located side-by-side within interlayer insulating layers. One such capacitor network that includes a MIM capacitor with patterned upper and lower electrodes and capacitively coupled electrode interconnects is disclosed in US 2007/0228506 to Min et al.

Unfortunately, techniques to increase the capacitance of integrated circuit capacitors typically involve relatively complicated fabrication processes and/or require relatively large area capacitor electrodes that reduce the overall integration density of circuits within a semiconductor substrate. To address these limitations associated with conventional capacitor fabrication techniques, new capacitor dielectric materials have been developed with increased dielectric strength. However, the use of these alternative materials can complicate fabrication processes and result in unwanted increases in parasitic coupling capacitances when used in proximity to non-capacitor structures and active devices. Thus, there continues to be a need for improved techniques for fabricating integrated circuit capacitors having relatively high capacitance and relatively high integration densities, that do not significantly increase fabrication complexity.

SUMMARY OF THE INVENTION

Methods of forming integrated circuit devices may include forming highly integrated passive networks, such as highly integrated capacitor networks. These highly integrated capacitor networks may be formed in peripheral circuit regions of an integrated circuit substrate having both highly integrated memory array regions and surrounding peripheral circuit regions therein. According to some of these embodiments of the present invention, a method of forming a three-dimensional capacitor network may include forming a first horizontal MIM capacitor on a semiconductor substrate and forming a first interlayer insulating layer on the first horizontal MIM capacitor. A first vertical capacitor electrode is then formed in the first interlayer insulating layer and a second horizontal MIM capacitor is formed on the first interlayer insulating layer. This second horizontal MIM capacitor may be formed by forming an upper capacitor electrode and a lower capacitor electrode. The upper capacitor electrode may be electrically connected by the first vertical capacitor electrode to an upper capacitor electrode of the underlying first MIM capacitor. The lower capacitor electrode, which may be formed in the first interlayer insulating layer, may extend opposite the upper electrodes of the first and second MIM capacitors.

These embodiments of the invention may also include forming a second vertical capacitor electrode in the interlayer insulating layer at the same time the first vertical capacitor electrode is formed. This second vertical capacitor electrode may also be electrically connected to the upper capacitor electrodes of the first and second horizontal MIM capacitors during subsequent processing. In particular, the first and second vertical capacitor electrodes may be formed to extend through the first interlayer insulating layer, on opposite sides of the lower capacitor electrode of the second horizontal MIM capacitor.

According to still further embodiments of the present invention, a method of forming a three-dimensional capacitor network may include forming a first horizontal MIM capacitor on a semiconductor substrate and forming an interlayer insulating layer on the first horizontal MIM capacitor. A plurality of interconnect openings are formed in the interlayer insulating layer. This plurality of interconnect openings extend through the interlayer insulating layer and expose an upper capacitor electrode of the first horizontal MIM capacitor. At least one capacitor electrode trench is also formed in the interlayer insulating layer. Each of the plurality of interconnect openings and the at least one capacitor electrode trench are filled with respective capacitor electrodes. An upper capacitor electrode of a second horizontal MIM capacitor is formed on the interlayer insulating layer. The upper capacitor electrode is electrically connected to the capacitor electrodes in the plurality of interconnect openings. The capacitor electrode(s) in the at least one capacitor electrode trench may also operate as a lower capacitor electrode(s) of the second horizontal MIM capacitor. According to additional aspects of these embodiments of the invention, the step of forming an upper capacitor electrode may be preceded by forming an etch-stop layer on the interlayer insulating layer. In this case, the step of forming an upper capacitor electrode may include forming an upper capacitor electrode on the etch-stop layer, which operates as a capacitor dielectric layer within the second horizontal MIM capacitor.

According to still further embodiments of the present invention, a method of forming a three-dimensional capacitor network includes forming an upper electrode of a first horizontal MIM capacitor on a substrate and forming a first interlayer insulating layer on the upper electrode of the first horizontal MIM capacitor. The first interlayer insulating layer is patterned to define a first plurality of interconnect openings therein that expose the upper electrode of the first horizontal MIM capacitor. The first plurality of interconnect openings are filled with first electrode interconnects. A second interlayer insulating layer is formed on the first interlayer insulating layer. The second interlayer insulating layer is patterned to define a second plurality of interconnect openings therein that expose the first electrode interconnects. The second plurality of interconnect openings are filled with second electrode interconnects that contact respective first electrode interconnects. An upper electrode of a second horizontal MIM capacitor is then formed on the second interlayer insulating layer and a third interlayer insulating layer is formed on the upper electrode of the second horizontal MIM capacitor. The third interlayer insulating layer is patterned to define a third plurality of interconnect openings therein that expose the upper electrode of the second horizontal MIM capacitor and expose respective second electrode interconnects. The third plurality of interconnect openings are then filled with third electrode interconnects that contact the upper electrode of the second horizontal MIM capacitor and contact the underlying second electrode interconnects.

According to further aspects of these embodiments of the invention, the step of forming an upper electrode of a second horizontal MIM capacitor may be preceded by forming a capacitor dielectric layer on the second interlayer insulating layer. In this embodiment, the step of forming a third interlayer insulating layer on the upper electrode of the second horizontal MIM capacitor includes forming a third interlayer insulating layer on the upper electrode of the second horizontal MIM capacitor and on the capacitor dielectric layer. The step of patterning the third interlayer insulating layer may include patterning the third interlayer insulating layer using the capacitor dielectric layer as an etch-stop layer. In particular, the step of patterning the third interlayer insulating layer may include selectively etching the capacitor dielectric layer to expose the second electrode interconnects.

Moreover, the step of patterning the second interlayer insulating layer may include patterning the second interlayer insulating layer to define at least one capacitor electrode trench therein. According to these embodiments of the invention, the step of filling the second plurality of interconnect openings includes filling the at least one capacitor electrode-trench with a lower MIM capacitor electrode. In this case, the step of forming upper electrode of a second horizontal MIM capacitor includes forming an upper electrode of a second horizontal MIM capacitor opposite the lower MIM capacitor electrode.

According to further embodiments of the invention, the step of forming an upper electrode of a first horizontal MIM capacitor may be preceded by forming an underlying insulating layer on the substrate and forming a pair of comb-shaped electrodes having a plurality of interdigitated teeth, in the underlying insulating layer. The first plurality of interconnect openings may expose a first one of the pair of comb-shaped electrodes, which is electrically connected to the first electrode interconnects. In addition, the second one of the pair of comb-shaped electrodes may have a plurality of spaced-apart teeth that operate as a lower electrode of the first horizontal MIM capacitor.

DETAILED DESCRIPTION OF THE PREFERRED EMBODIMENTS

Figure 1A:
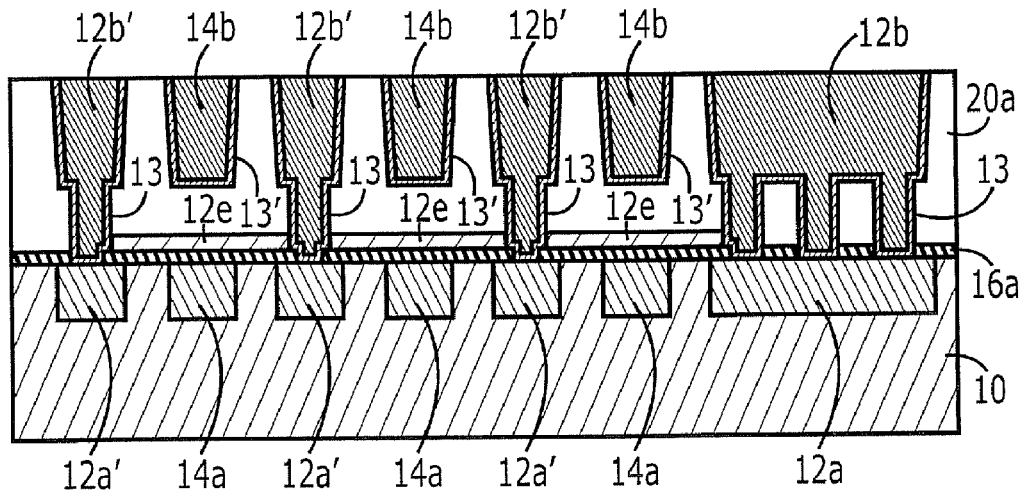
FIGS. 1A-1C are cross-sectional views of intermediate structures that illustrate methods of forming three-dimensional capacitor networks according to embodiments of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 1B:
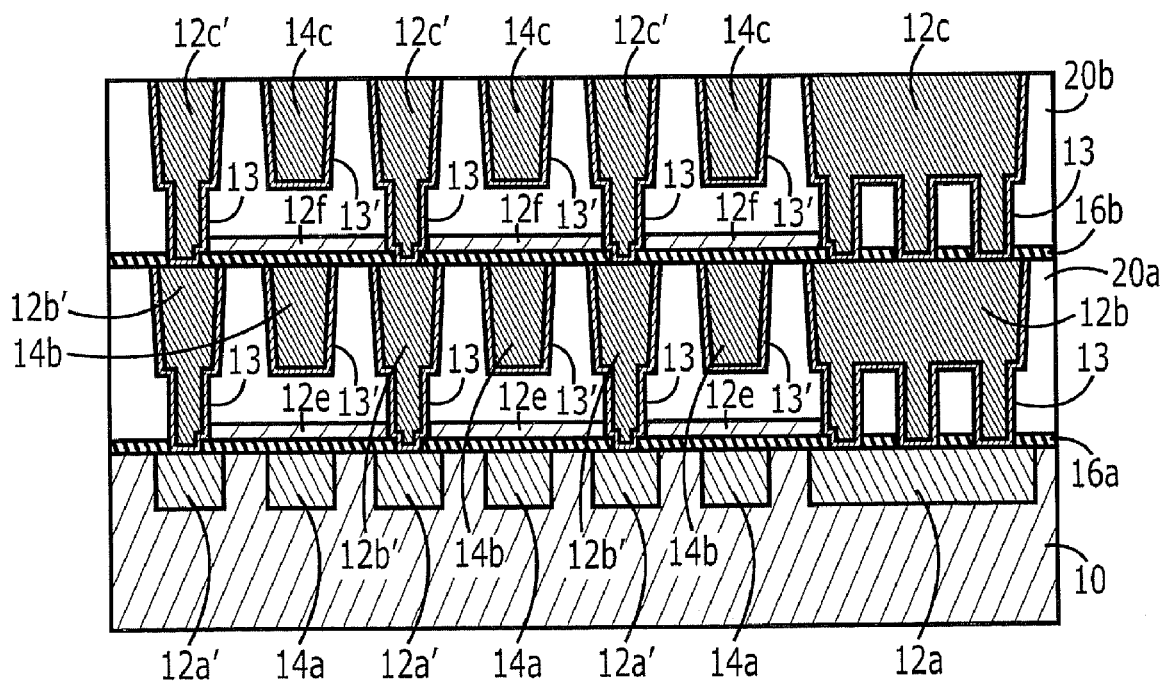
Figure 1C:
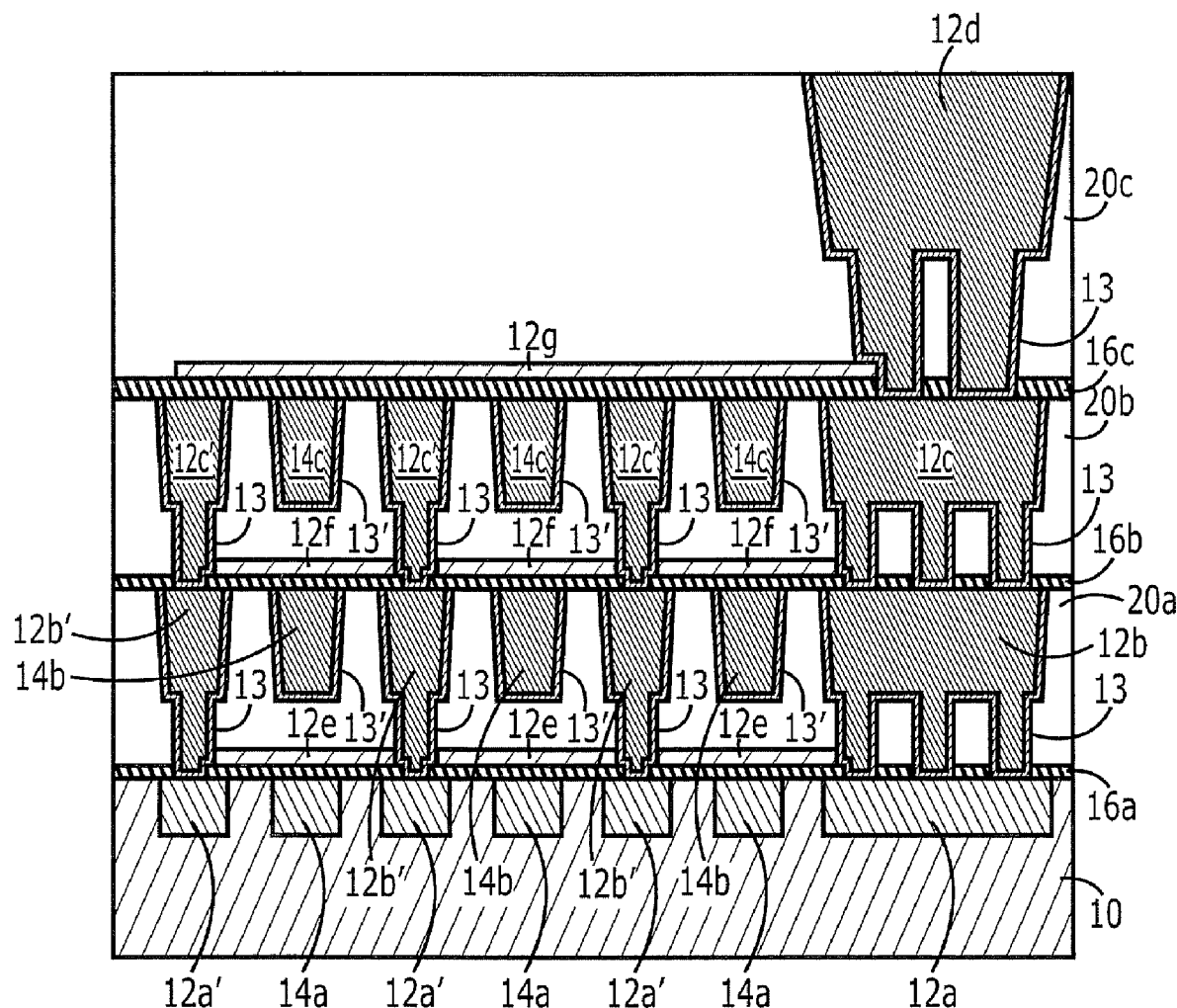

Methods of forming three-dimensional capacitor networks according to embodiments of the present invention are illustrated by FIGS. 1A-1C. These methods include forming a first horizontal MIM capacitor on a semiconductor substrate 10. As illustrated by FIG. 1A, the first horizontal MIM capacitor may include a first plurality of lower electrodes 14a within the semiconductor substrate 10 and a first upper electrode 12e on the first plurality of lower electrodes 14a. The first plurality of lower electrodes 14a and the first upper electrode 12e are separated from each other by a first capacitor dielectric layer 16a, which may also operate as an etch-stop layer during processing. The first upper electrode 12e is electrically coupled to a plurality of vertical electrical interconnects 12b and 12b', which may operate as first vertical capacitor electrodes, as explained more fully hereinbelow. These first vertical capacitor electrodes 12b and 12b' are also electrically coupled to first semiconductor regions 12a' and 12a, which may be formed as N-type diffusion regions within a P-type semiconductor substrate 10 or within a P-type semiconductor well region (not shown), for example. According to preferred embodiments of the present invention, the first plurality of lower electrodes 14a are formed as a first plurality of stripe-shaped semiconductor regions (e.g., N-type fingers) within the substrate 10, and the first semiconductor regions 12a and 12a' are formed as a second plurality of stripe-shaped semiconductor regions (e.g., N-type fingers). In particular, the first and second pluralities of stripe-shaped semiconductor regions may be interdigitated fingers that are capacitively coupled to each other within the substrate 10.

Referring still to FIG. 1A, the first capacitor dielectric layer 16a is deposited on an upper surface of the semiconductor substrate 10. This first capacitor dielectric layer 16a may be formed using a relatively high dielectric constant material such as SiN, SiCN, SiC, SiON and SiBN and may have a thickness in a range from about 100 Å to about 1000 Å. The first upper electrode 12e is then formed on the first capacitor dielectric layer 16a by depositing a metal layer (e.g., Ta, TaN, Ti, TiN) having a thickness in a range from about 100 Å to about 1000 Å and then patterning the deposited metal layer by selectively etching it using the first capacitor dielectric layer 16a as an etch-stop layer.

A first interlayer insulating layer 20a is then formed on the first horizontal MIM capacitor. According to some embodiments of the present invention, the first interlayer insulating layer 20a may be formed as a stacked composite of two or more electrically insulating layers and the first vertical capacitor electrodes 12b, 12b' may be formed using dual-damascene fabrication techniques. In particular, dual-damascene fabrication techniques may be used to define openings in the first interlayer insulating layer 20a, which expose the first upper electrode 12e, and also define the first vertical capacitor electrodes 12b, 12b' as copper electrodes that are separated from surrounding portions of the first interlayer insulating layer 20a by copper diffusion barrier layers 13. These copper diffusion barrier layers 13 may be formed as Ta, TaN, Ti and/or TiN metal layers.

These damascene fabrication techniques may also include steps to form a plurality of lower capacitor electrodes 14b of a second horizontal MIM capacitor in corresponding trenches, which are formed at side-by-side locations within an upper surface of the first interlayer insulating layer 20a. In particular, trenches formed within an upper surface of the first interlayer insulating layer 20a may be used to define the shape of upper portions of the first vertical capacitor electrodes 12b and 12b' in addition to defining the dimensions of the lower capacitor electrodes 14b. Copper diffusion barrier layers 13' may also be deposited to line bottoms and sidewalls of the trenches receiving the lower capacitor electrodes 14b, as illustrated.

Referring now to FIG. 1B, the second horizontal MIM capacitor may include the plurality of lower electrodes 14b within the upper surface of the first interlayer insulating layer 20a and a second upper electrode 12f on the plurality of lower electrodes 14b. The second upper electrode 12f and the plurality of lower electrodes 14b are separated from each other by a second capacitor dielectric layer 16b, which may have the same composition and dimensions as the first capacitor dielectric layer 16a and also operate as an etch-stop layer during processing. The second upper electrode 12f is formed on the second capacitor dielectric layer 16b by depositing a metal layer (e.g., Ta, TaN, Ti, TiN) having a thickness in a range from about 100 Å to about 1000 Å and then patterning the deposited metal layer by selectively etching it using the second capacitor dielectric layer 16b as an etch-stop layer.

The second upper electrode 12f is electrically coupled to a plurality of vertical electrical interconnects 12c and 12c' within a second interlayer insulating layer 20b and the plurality of vertical electrical interconnects 12b and 12b' within the first interlayer insulating layer 20a. The plurality of vertical electrical interconnects 12c and 12c' also operate as second vertical capacitor electrodes.

The second interlayer insulating layer 20b, which is formed on the second horizontal MIM capacitor, may be formed as a stacked composite of two or more electrically insulating layers and the second vertical capacitor electrodes 12c, 12c' may be formed as copper electrodes using dual-damascene fabrication techniques. In particular, these dual-damascene fabrication techniques may be used to define openings in the second interlayer insulating layer 20b, which expose the second upper electrode 12f, and also define the second vertical capacitor electrodes 12c, 12c' as copper electrodes. These copper electrodes may be separated from surrounding portions of the second interlayer insulating layer 20b by copper diffusion barrier layers 13'.

These damascene fabrication techniques may also include steps to form a plurality of lower capacitor electrodes 14c of a third horizontal MIM capacitor in corresponding trenches, which are formed at side-by-side locations within an upper surface of the second interlayer insulating layer 20b. In particular, trenches formed within an upper surface of the second interlayer insulating layer 20b may be used to define the shape of upper portions of the second vertical capacitor electrodes 12c and 12c' in addition to defining the dimensions of the lower capacitor electrodes 14c. Copper diffusion barrier layers 13' may also be deposited to line bottoms and sidewalls of the trenches receiving the lower capacitor electrodes 14c, as illustrated.

Referring now to FIG. 1C, a third capacitor dielectric layer 16c, which may have the same thickness and material composition as the first and second dielectric layers 16a-16b, is deposited on the second interlayer insulating layer 20b. Thereafter, a third upper electrode 12g is formed on the third capacitor dielectric layer 16c. This third upper electrode 12g may be formed to have the same composition, thickness and lateral dimensions as the second upper electrode 12f. A third interlayer insulating layer 20c is then deposited on the third capacitor dielectric layer 16c and the third upper electrode 12g. Dual damascene fabrication techniques may then be used to form a copper diffusion barrier layer 13 and a copper interconnect 12d in the third interlayer insulating layer 20c, as illustrated. This copper interconnect 12d is electrically connected to the second vertical capacitor electrodes 12c and 12c', the first vertical capacitor electrodes 12b and 12b' and the first semiconductor regions 12a and 12a', to thereby define a first terminal of a three-dimensional capacitor network. Similarly, the first plurality of lower electrodes 14a, 14b and 14c of the first, second and third horizontal MIM capacitors are electrically connected together in a third dimension (not shown) to thereby define a second terminal of the three-dimensional capacitor network.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a three-dimensional capacitor network, comprising:

forming a first horizontal MIM capacitor comprising a planar and non-interdigitated upper capcitor electrode and a first capacitor dielectric layer containing a first dielectric material, on a semiconductor substrate, said semiconductor substrate comprising a first plurality of stripe-shaped semiconductor regions and a second stripe-shaped semiconductor region extending between first and second ones of the first plurality of stripe-shaped semiconductor regions;

forming a first interlayer insulating layer on the first horizontal MIM capacitor, said first interlayer insulating layer comprising a second dielectric material having a lower dielectric constant relative to the first dielectric material;

forming first and second vertical capacitor electrodes in the first interlayer insulating layer, said first and second vertical capacitor electrodes electrically connected to the first and second ones of the first plurality of stripe-shaped semiconductor regions, respectively; and forming a second horizontal MIM capacitor on the first interlayer insulating layer, by:

forming a non-interdigitated upper capacitor electrode electrically connected in parallel by the first and second vertical capacitor electrodes to the upper capacitor electrode of the first MIM capacitor;

forming a lower capacitor electrode in the first interlayer insulating layer that extends opposite the upper electrodes of the first and second MIM capacitors and between the first and second vertical capacitor electrodes, said lower capacitor electrode electrically connected to the second stripe-shaped semiconductor region; and forming a second capacitor dielectric layer of the second horizontal MIM capacitor on the first interlayer insulating layer and on the lower capacitor electrode of the second horizontal MIM capacitor, said second capacitor dielectric layer comprising a third dielectric material having a higher dielectric constant relative to the second dielectric material;

wherein said forming first and second vertical capacitor electrodes and said forming a lower capacitor electrode in the first interlayer insulating layer comprise filling trenches in the first interlayer insulating layer with electrically conductive materials before said forming the capacitor dielectric layer of the second horizontal MIM capacitor; and wherein the first vertical capacitor electrode and the second vertical capacitor electrode extend through the first interlayer insulating layer to a greater extent than a portion of the lower capacitor electrode extending between the first and second vertical capacitor electrodes.

* * * * *